United States Patent [19]
Kim et al.

[11] Patent Number: 5,942,032
[45] Date of Patent: Aug. 24, 1999

[54] HEAT SHIELD ASSEMBLY AND METHOD OF GROWING VACANCY RICH SINGLE CRYSTAL SILICON

[75] Inventors: Kyong-Min Kim; William L. Luter; Lee W. Ferry, all of St. Charles, Mo.; Robert J. Braun, Belleville, Ill.; Srdjan Ilic; Mauro Dioda, both of Bolzano, Italy; Paolo Tosi, Merano, Italy; Marco Gobbo, Merano, Italy; Umberto Martini, Merano, Italy

[73] Assignee: MEMC Electronic Materials, Inc., St. Peters, Mo.

[21] Appl. No.: 08/904,943

[22] Filed: Aug. 1, 1997

[51] Int. Cl.⁶ ........................................ C30B 15/14
[52] U.S. Cl. ........................ 117/13; 117/30; 117/35; 117/208; 117/217
[58] Field of Search ...................... 117/13, 30, 35, 117/208, 217

[56] References Cited

U.S. PATENT DOCUMENTS

| | | | |
|---|---|---|---|
| 3,798,007 | 3/1974 | Bochman et al. | 23/301 |
| 4,330,361 | 5/1982 | Kuhn-Kuhnenfeld et al. | 156/617 |
| 4,330,362 | 5/1982 | Zulehner | 156/617 |
| 4,956,153 | 9/1990 | Yamagishi et al. | 422/249 |
| 4,981,549 | 1/1991 | Yamagishi et al. | 156/620.4 |

(List continued on next page.)

FOREIGN PATENT DOCUMENTS

| | | | |
|---|---|---|---|
| 595269 A1 | 5/1994 | European Pat. Off. . | |
| 59-008692 | 1/1984 | Japan . | |
| 59-8692 | 1/1984 | Japan | 117/217 |
| 1-100086 | 4/1989 | Japan . | |
| 4-46099 | 2/1992 | Japan | 117/217 |
| 5-294784 | 11/1993 | Japan . | |
| 7-267777 | 3/1994 | Japan . | |
| 6-247789 | 9/1994 | Japan . | |
| 7-033587 | 2/1995 | Japan . | |
| 7-061888 | 3/1995 | Japan . | |
| 7-061889 | 3/1995 | Japan . | |
| 7-069779 | 3/1995 | Japan . | |
| 7-089790 | 4/1995 | Japan . | |
| 7-267777 | 10/1995 | Japan . | |
| 8-026884 | 1/1996 | Japan . | |
| 8-026890 | 1/1996 | Japan . | |
| 8-059386 | 3/1996 | Japan . | |
| 8-091980 | 4/1996 | Japan . | |
| 8-091982 | 4/1996 | Japan . | |
| 8-104590 | 4/1996 | Japan . | |
| 8-119788 | 5/1996 | Japan . | |
| 8-133886 | 5/1996 | Japan . | |
| 9-315882 | 5/1996 | Japan . | |
| 8-245293 | 9/1996 | Japan . | |
| 8-259371 | 10/1996 | Japan . | |

OTHER PUBLICATIONS

Abstract of Japanese Patent 06293589-A from "Semiconductor Materials & Processes", p. 2 (9501–9504).
Abstract of Japanese Patent 06305878-A from "Semiconductor Materials & Processes", p. 6 (9501–9504).
International Search Report.

Primary Examiner—Robert Kunemund
Attorney, Agent, or Firm—Senniger, Powers, Leavitt & Roedel

[57] ABSTRACT

A heat shield assembly is used in a Czochralski crystal puller for selectively shielding a monocrystalline ingot of semiconductor material to control the type and number density of agglomerated defects in the crystal structure of the ingot. The heat shield assembly has an upper heat shield connected to a lower heat shield. The upper and lower heat shields are connected to each other and slidingly connected to an intermediate heat shield. The lower heat shield is able to telescope up into the intermediate heat shield to minimize the profile of the heat shield assembly located within a crystal growth chamber of the crystal puller. However when needed to control formation of the monocrystalline ingot, the lower heat shield may be extended from the intermediate heat shield and project downwardly into the crystal puller crucible in close proximity to an upper surface of molten semiconductor source material in the crucible. A method employing the heat shield assembly is also disclosed.

16 Claims, 6 Drawing Sheets

U.S. PATENT DOCUMENTS

| | | | |
|---|---|---|---|
| 5,004,519 | 4/1991 | Hariri | 156/620.4 |
| 5,009,862 | 4/1991 | Kida et al. | 422/249 |
| 5,009,863 | 4/1991 | Shima et al. | 422/249 |
| 5,196,173 | 3/1993 | Arai et al. | 422/249 |
| 5,292,487 | 3/1994 | Tatsumi et al. | 422/249 |
| 5,361,721 | 11/1994 | Takano et al. | 117/214 |
| 5,373,805 | 12/1994 | Takano et al. | 117/208 |
| 5,443,034 | 8/1995 | Everts | 117/217 |
| 5,450,814 | 9/1995 | Shiraishi et al. | 117/217 |
| 5,476,065 | 12/1995 | Ikezawa et al. | 117/217 |
| 5,567,399 | 10/1996 | Von Ammon et al. | 722/245.1 |
| 5,575,847 | 11/1996 | Kuramochi et al. | 117/210 |
| 5,683,505 | 11/1997 | Kuramochi et al. | 117/217 |

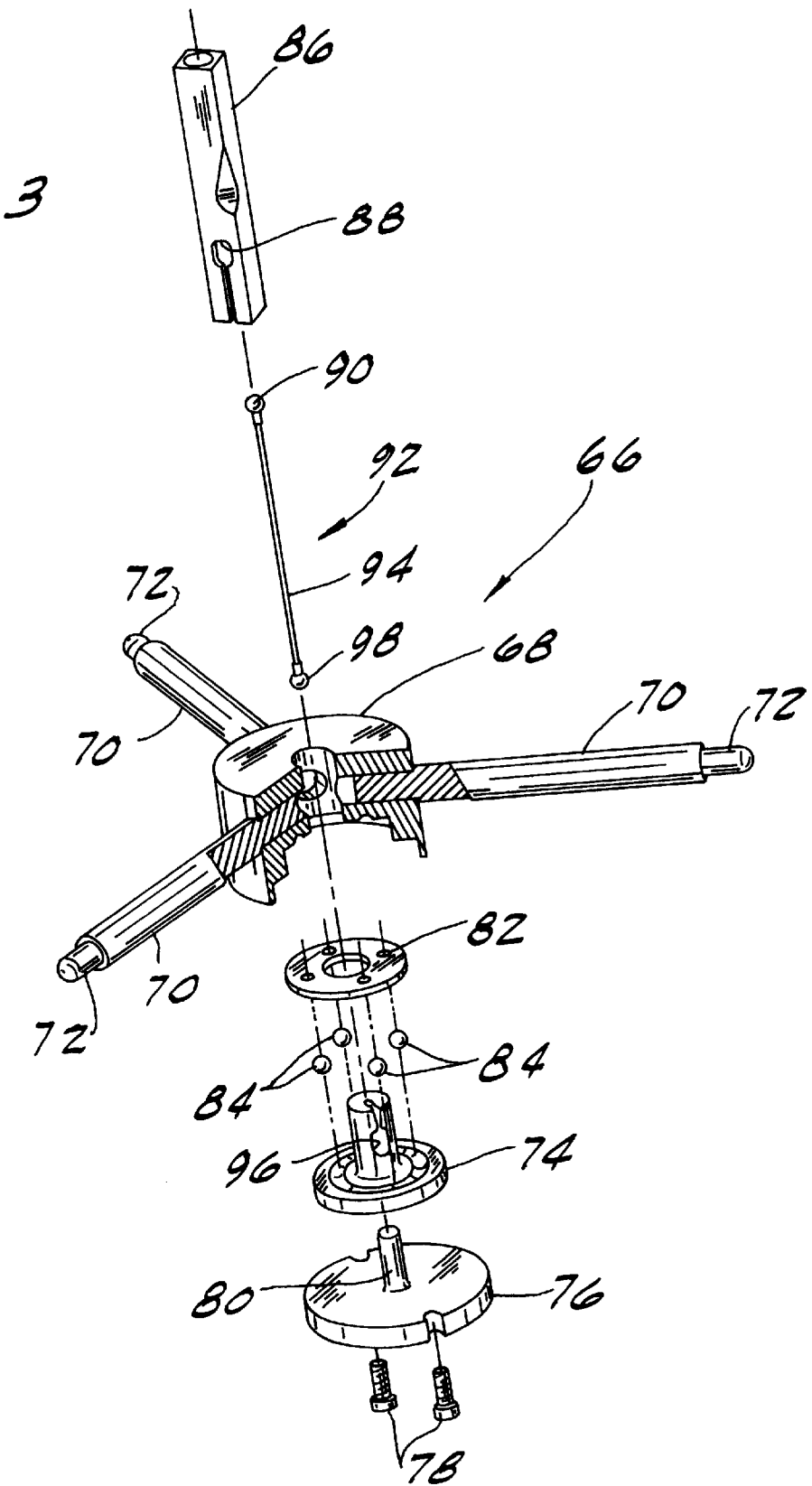

HEAT SHIELD ASSEMBLY AND METHOD OF GROWING VACANCY RICH SINGLE CRYSTAL SILICON

BACKGROUND OF THE INVENTION

The present invention relates generally to the production of semiconductor grade single crystal silicon used in the manufacture of electronic components, and more particularly to a heat shield assembly used in the growth of such semiconductor material.

Single crystal silicon, which is the starting material for most processes for the fabrication of semiconductor electronic components, is commonly prepared by the so-called Czochralski ("Cz") method. The growth of the crystal is most commonly carried out in a crystal pulling furnace. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

Although the conventional Czochralski growth method has been satisfactory for growing single crystal silicon useful in a wide variety of applications, further improvements in the quality of the semiconductor material are desirable. As the width of the integrated circuit lines formed on the semiconductor material are reduced, the presence of defects in the crystal become of greater concern. A number of defects in single crystal silicon form in the crystal growth chamber as the crystal cools after solidification. Such defects arise, in part, because of the presence of an excess (i.e., a concentration above the solubility limit) of intrinsic point defects, which are known as vacancies and self-interstitials. Vacancies, as their name suggests, are caused by the absence or "vacancy" of a silicon atom in the crystal lattice. Self-interstitials are produced by the presence of an extra silicon atom in the lattice. Both kinds of defects adversely affect the quality of the semiconductor material.

Silicon crystals grown from a melt are typically grown with an excess of one or the other type of intrinsic point defect, either crystal lattice vacancies or silicon self-interstitials. It is understood that the type and initial concentration of these point defects in the silicon, which become fixed at the time of solidification, are controlled by the ratio $v/G_0$, where v is the growth velocity and $G_0$ is the instantaneous axial temperature gradient in the crystal at the time of solidification. As the value of $v/G_0$ exceeds a critical value, the concentration of vacancies increases. Likewise, as the value of $v/G_0$ falls below the critical value, the concentration of self-interstitials increases. Although neither form of defect is desirable, growth regimes which produce a predominance of vacancies are preferred, in general, by the semiconductor industry.

It is known to reduce the number density of intrinsic point defects by controlling $v/G_0$ to grow a crystal lattice in which crystal lattice vacancies are the dominant intrinsic point defect, and by reducing the nucleation rate of agglomerated defects by altering (generally, by slowing down) the cooling rate of the silicon ingot from about 1100° C. to 1050° C. during the crystal pulling process. Another approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to annihilate the defects which form during the crystal growth process. Such heat treatments have been shown to reduce the defect density in a thin region near the wafer surface. The specific treatment needed will vary depending upon the concentration and location of agglomerated intrinsic point defects in the wafer. Different wafers cut from a crystal which does not have a uniform axial concentration of such defects may require different post-growth processing conditions. Furthermore, such wafer heat treatments are relatively costly, have the potential for introducing metallic impurities into the silicon wafers, and are not universally effective for all types of crystal-related defects.

Still another approach to dealing with the problem of agglomerated intrinsic point defects is the epitaxial deposition of a thin crystalline layer of silicon on the surface of a single crystal silicon wafer.

This process provides a single crystal silicon wafer having a surface which is substantially free of agglomerated intrinsic point defects. Epitaxial deposition, however, substantially increases the cost of the wafer.

In order to facilitate predomination of vacancy defects, and avoid the presence of a radial vacancy/self-interstitial boundary ring in the crystal, $v/G_0$ is controlled to be as high as possible. One way to increase the ratio is to increase the pull rate (growth velocity) of the crystal. However other factors such as diameter control of the crystal limit the amount the pull rate may be increased. The other way to attack the problem is to reduce the thermal gradient $G_0$ in the crystal. In that regard, a heat shield may be disposed within the crucible which conserves heat at the liquid-gas-solid interface, by forming a partial thermal cavity, the heat lost from the free melt surface. In this way the instantaneous axial thermal gradient ($G_0$) at the interface is reduced, which increases the ratio $v/G_0$. However, shields of this type which are fixed in the crystal pulling furnace obstruct the crucible, making it difficult to load new semiconductor source material into the crucible prior to melting. Although a shield might be removed, it is not easy to replace the shield because the furnace must remain substantially sealed once the melting of the source material commences. Further, many conventional crystal pulling furnaces have so little space in the crystal growth chamber, that it is impractical to mount a fixed shield in the chamber.

The problem of space becomes even more critical when attempting to reduce the thermal gradient in the crystal in the range of 1100° C. to 1050° C. Physically, this temperature range occurs at a location in the single crystal silicon substantially above the level of the melt in the crucible. Thus, an even larger shield would be necessary in order to provide both for focusing heat at the liquid-gas-solid interface in the crucible and for retarding heat transfer above the crucible. Thus, there is presently a need for a compact, easily manipulated heat shield assembly which is capable of focusing heat at the liquid-gas-solid interface, and retarding heat transfer above the interface.

SUMMARY OF THE INVENTION

Among the several objects and features of the present invention may be noted the provision of a heat shield assembly and method for a crystal puller which facilitates growth of high quality, low defect single crystals; the provision of such a heat shield assembly and method which inhibits agglomeration of defects in the crystal growth process; the provision of such a heat assembly and method which facilitates high throughput in the crystal puller; the provision of such a heat shield assembly and method which is capable of operating in confined space within a crystal puller; the provision of such a heat shield assembly and method which can be readily used in existing crystal pullers; the provision of such a heat shield assembly which can be raised and lowered using the existing pulling mechanism of the crystal puller; and the provision of such a heat shield assembly and method which is easy to use.

Generally, a heat shield assembly for use in a crystal puller around a monocrystalline ingot grown in the crystal puller to affect cooling rates of the crystal comprises an upper heat shield having a central passage for receiving the crystal therein such that the upper shield surrounds the crystal. The upper shield has connector means for connecting the heat shield assembly to a pulling mechanism of the crystal puller to raise and lower the heat shield assembly within the crystal puller. An intermediate heat shield has a central passage for receiving the crystal through the intermediate heat shield with the intermediate heat shield surrounding the crystal. The intermediate heat shield is constructed for engaging structure in the crystal puller to support the heat shield assembly in the crystal puller. A lower heat shield has a central passage for receiving the crystal through the lower heat shield with the lower heat shield surrounding the crystal. The lower heat shield is connected to the upper heat shield for conjoint movement therewith and is slidingly and telescopingly received in the intermediate heat shield. The upper and lower heat shields are movable between a lower position in the crystal puller in which the lower shield is telescoped out of the intermediate heat shield and engages the intermediate heat shield for supporting the upper and lower heat shields, and a raised position in which the lower heat shield is telescoped upwardly into the intermediate heat shield and engages the intermediate heat shield for supporting the intermediate heat shield to move upwardly with the upper and lower heat shields.

Generally, a method of growing vacancy rich single crystals comprises the steps of placing solid semiconductor source material in a crucible of a crystal puller and hanging a collapsible heat shield assembly on a pulling mechanism in the crystal puller above the crucible. The heat shield assembly as hung on the pulling mechanism is in a collapsed configuration. The solid semiconductor source material is heated to bring about melting of the source material. The heat shield assembly is lowered into engagement with support structure in the crystal puller generally above the crucible, the heat shield assembly assuming an extended position whereby a portion of the heat shield extends into the crucible in proximity to the surface of the molten semiconductor source material in the crucible. The heat shield assembly is disconnected from the pulling mechanism and a seed crystal is attached to the pulling mechanism. A seed crystal is lowered into contact with a melt of molten semiconductor source material in a crucible of a crystal puller and then raised from the melt so that semiconductor material from the melt freezes on the seed crystal to form a single crystal. Heat radiated from the side walls of the crucible is conserved with the heat shield assembly in a region adjacent the surface of the melt and located below the top of the crucible for inhibiting a high instantaneous axial thermal gradient in the single crystal in the region, whereby the single crystal has no vacancy/self-interstitial boundary ring or oxidation induced stacking fault ring. The single crystal is thermally shielded with the heat shield assembly at a location above the melt surface to slow cooling of the crystal in the range of approximately 1150° C. to 1000° C. whereby the single crystal has a predominance of vacancy defects and a low density of agglomerated vacancy defects.

Other objects and features of the present invention will be in part apparent and in part pointed out hereinafter.

BRIEF DESCRIPTION OF THE DRAWINGS

FIG. 3 is an exploded perspective of a hanger for connecting the heat shield assembly to a pulling mechanism of the crystal puller;

Corresponding reference characters indicate corresponding parts throughout the several views of the drawings.

DETAILED DESCRIPTION OF THE PREFERRED EMBODIMENT

Figure 1:
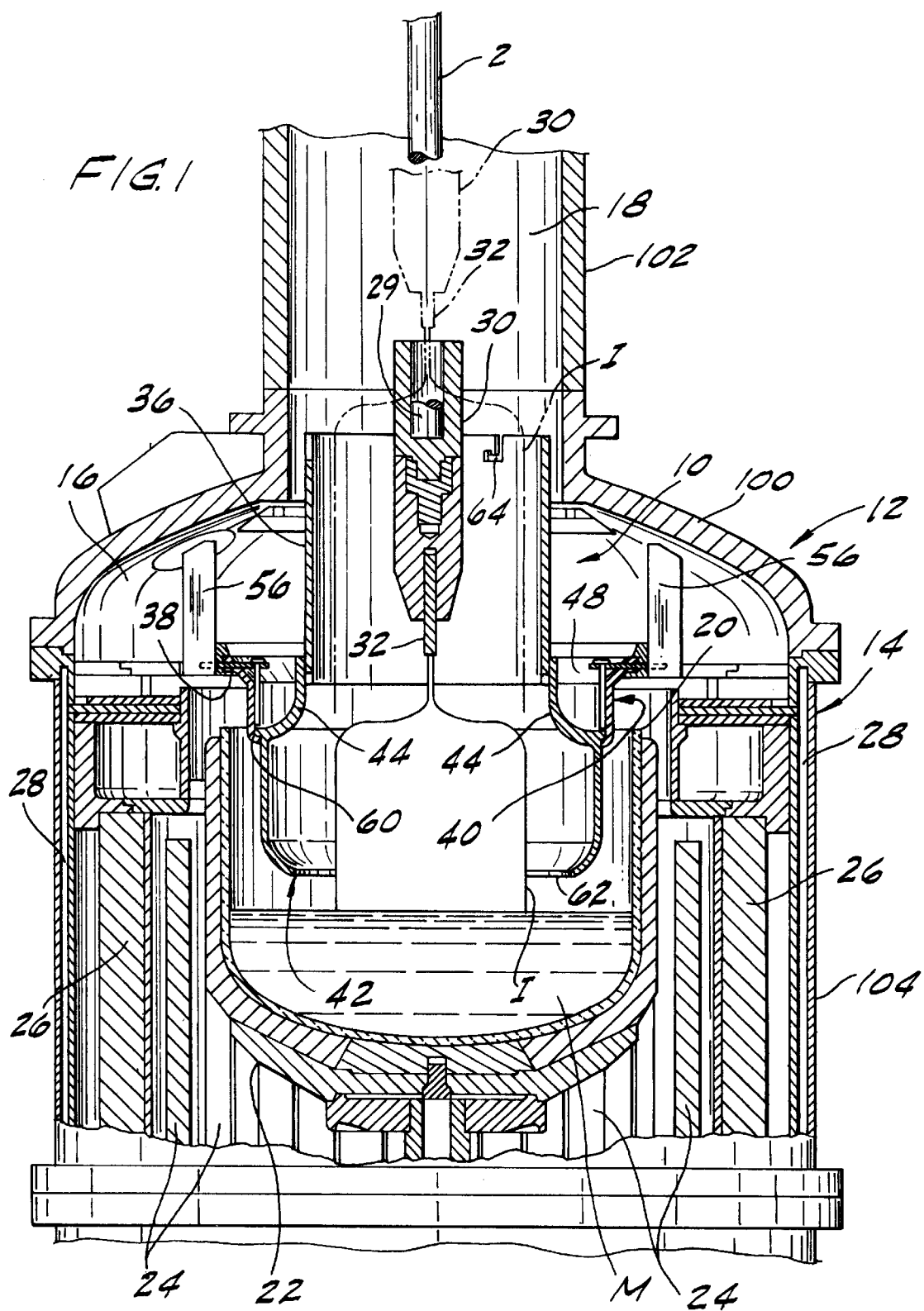
FIG. 1 is a schematic, fragmentary vertical section of a crystal puller showing a heat shield assembly as it is positioned during growth of a single crystal silicon ingot.
Figure 2:
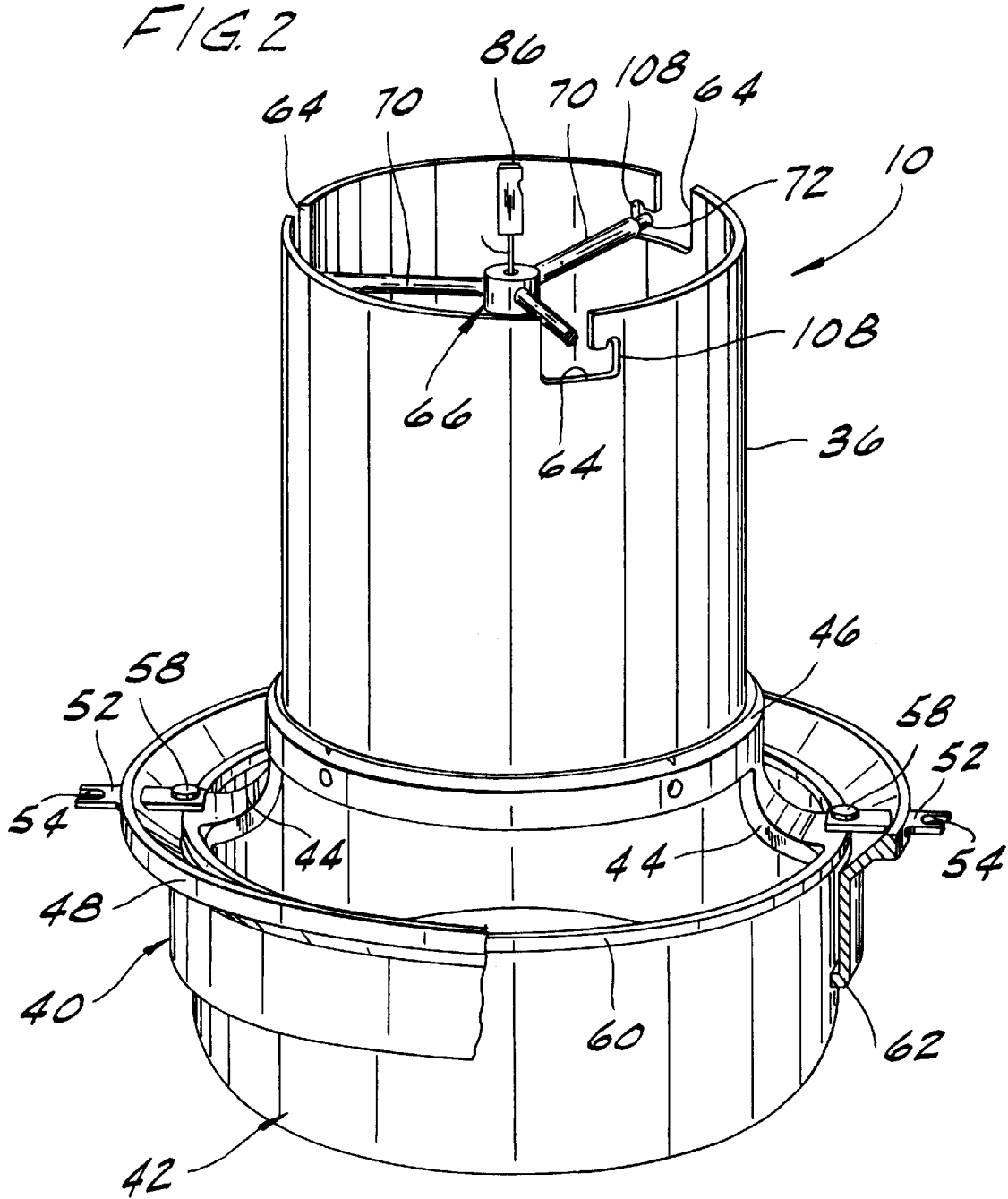
FIG. 2 is a perspective view of the heat shield assembly with a portion of an intermediate heat shield of the assembly broken away.

Referring now to the drawings and in particular to FIGS. 1 and 2, a heat shield assembly constructed according to the principles of the present invention is generally indicated at 10. The heat shield assembly is preferably for use in a crystal puller, indicated generally at 12, of the type used to grow monocrystalline silicon ingots (e.g., ingot I of FIG. 1) according to the Czochralski method. The crystal puller 12 includes a shell (generally indicated at 14) for isolating an interior which includes a lower crystal growth chamber 16 and an upper pull chamber 18. The pull chamber has a smaller transverse dimension than the growth chamber. A quartz crucible 20 contains molten semiconductor source material M from which the monocrystalline silicon ingot I is grown. The crucible 20 includes a cylindrical side wall and is mounted on a turntable 22 for rotation about a vertical axis. The crucible 20 is also capable of being raised within the growth chamber 16 to maintain the surface of the molten source material M at the same level as the ingot I is grown and source material is removed from the melt.

A heater includes generally vertically arranged heating panels 24 which are partially aligned with the side wall of the crucible 20. The heating panels 24 heat the crucible 20 and the interior of the crystal puller 12 to temperatures above the melting point of the source material (e.g., silicon). Insulation 26 is positioned to confine the heat to the interior of the shell 14. In addition, there are passages in the shell 14 and elsewhere in the crystal puller 12 for circulation of cooling water. Some of these passages are designated by the reference numeral 28 in FIG. 1. A pulling mechanism includes a pull shaft 29 extending down from a winch is above the pull chamber 18. The crystal puller 12 may have a pull wire rather than a shaft, depending upon the type of puller. The pull shaft terminates in a seed crystal chuck 30 which holds a seed crystal 32 used to grow the monocrystalline ingot I. The pull shaft 29 has been partially broken away in FIG. 1 for clarity in illustration of a raised position of the seed chuck 30 and ingot I shown in phantom. The general construction and operation of the crystal puller 12, except to the extent explained more fully below, is well known to those of ordinary skill in the art and will not be further described.

The heat shield assembly 10 of the present invention is employed during growth of the monocrystalline ingot I to control the heating and cooling of the ingot advantageously to produce a single crystal having fewer defects. The heat shield assembly 10 includes an upper heat shield 36 located above the crucible 20 which is free of engagement with the crystal puller shell 14. The upper heat shield 36 is generally tubular in shape, having a central passage for receiving the ingot I through the upper heat shield. The upper heat shield 36 preferably completely surrounds any portion of the ingot I received in the central passage and is interposed between the ingot I and the most closely adjacent interior walls of the shell 14. Heat transfer between the ingot I and the relatively cool interior walls of the shell is inhibited by the upper heat shield 36 for reducing the nucleation rate of agglomerated defects in the ingot within the upper heat shield above the crucible 20.

A bottom heat shield of the heat shield assembly 10 is constructed to rest on an annular support structure 38 within the crystal puller shell 14 and to extend downwardly into the crucible 20. In the illustrated embodiment, the bottom heat shield comprises an intermediate heat shield 40 and a lower heat shield 42 (both reference numbers designating their subjects generally). The intermediate heat shield 40 is generally tubular in shape and has a central passage for receiving the ingot I through the shield. The lower heat shield 42 is generally bowl shaped and has a central passage for receiving a portion of the ingot I into the lower heat shield. The lower edge margin of the lower heat shield 42 curves inwardly. The lower end of the lower heat shield 42 is spaced above the surface of the melt M in the lowest position of the heat shield assembly 10 for promoting heat transfer from the heating panels 24 through the side wall of the crucible 20 to the ingot I at the liquid-gas-solid interface at the surface of the melt.

The lower heat shield 42 is made of a suitable material, such as silicon carbide coated graphite and includes a lower bowl portion and two arms 44 extending upwardly and inwardly from the top of the bowl portion to a collar 46. As best seen in FIG. 2, the arms 44 are located at circumferentially spaced positions at the top of the bowl portion so that the lower heat shield 42 is substantially open on its sides above the bowl portion. A lower edge margin of the upper heat shield 36 is received in the collar 46 and secured to the collar by suitable fasteners so that the upper and lower heat shields 36, 42 are rigidly connected together for conjoint movement.

Figure 1A:
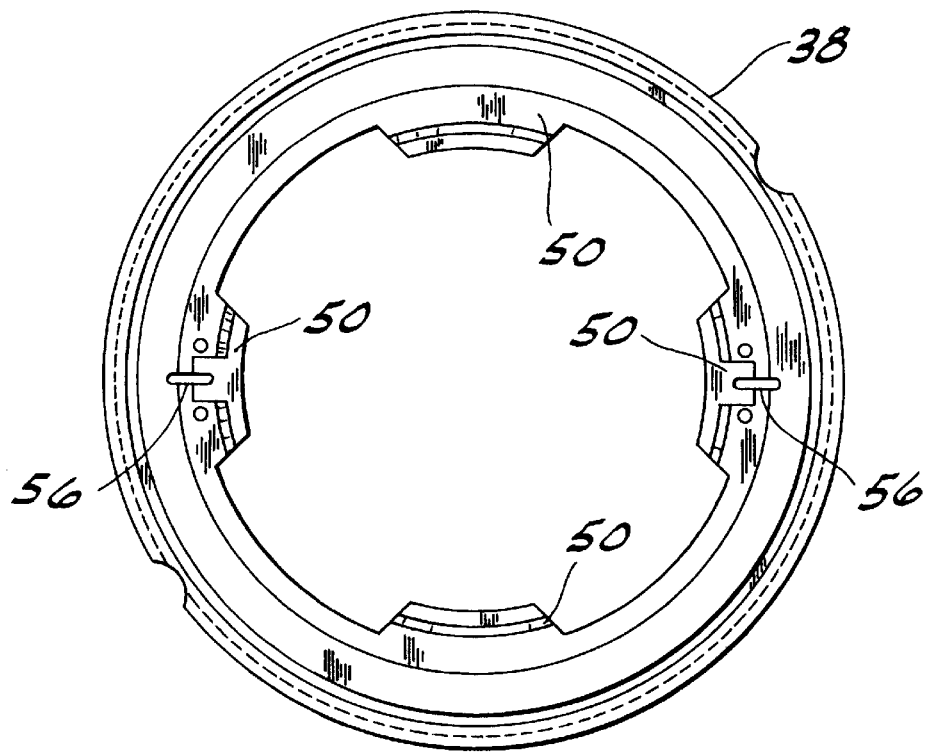
FIG. 1A is a top plan view of a support structure of the crystal puller which supports the heat shield assembly.

The intermediate heat shield 40 has a radially outwardly flaring annular lip 48 at its top edge margin. The lip 48 has a shape complementary to the shape of four radially inwardly projecting tabs 50 (FIG. 1A) of the support structure 38, and rests on the tabs. The support structure 38 holds the intermediate heat shield 40 in a predetermined vertical location over the crucible 20 when the heat shield assembly 10 is in its operating position. In the illustrated embodiment, the intermediate heat shield 40 extends downwardly into the crucible 20 a short distance. Guide/follower plates 52 are mounted on the intermediate heat shield 40 and received through respective openings in the lip 48 on opposite sides of the intermediate heat shield. The radially outer ends of the guide and follower plates 52 outside the intermediate heat shield 40 have notches 54 which receive portions of respective quartz guide posts 56 mounted on the support structure 38 in the crystal puller 12. The guide/follower plates 52 are capable of sliding along the height of the guide posts 56 so that the guide posts guide the heat shield assembly 10 as it is raised and lowered within the crystal puller 12.

Figure 6:
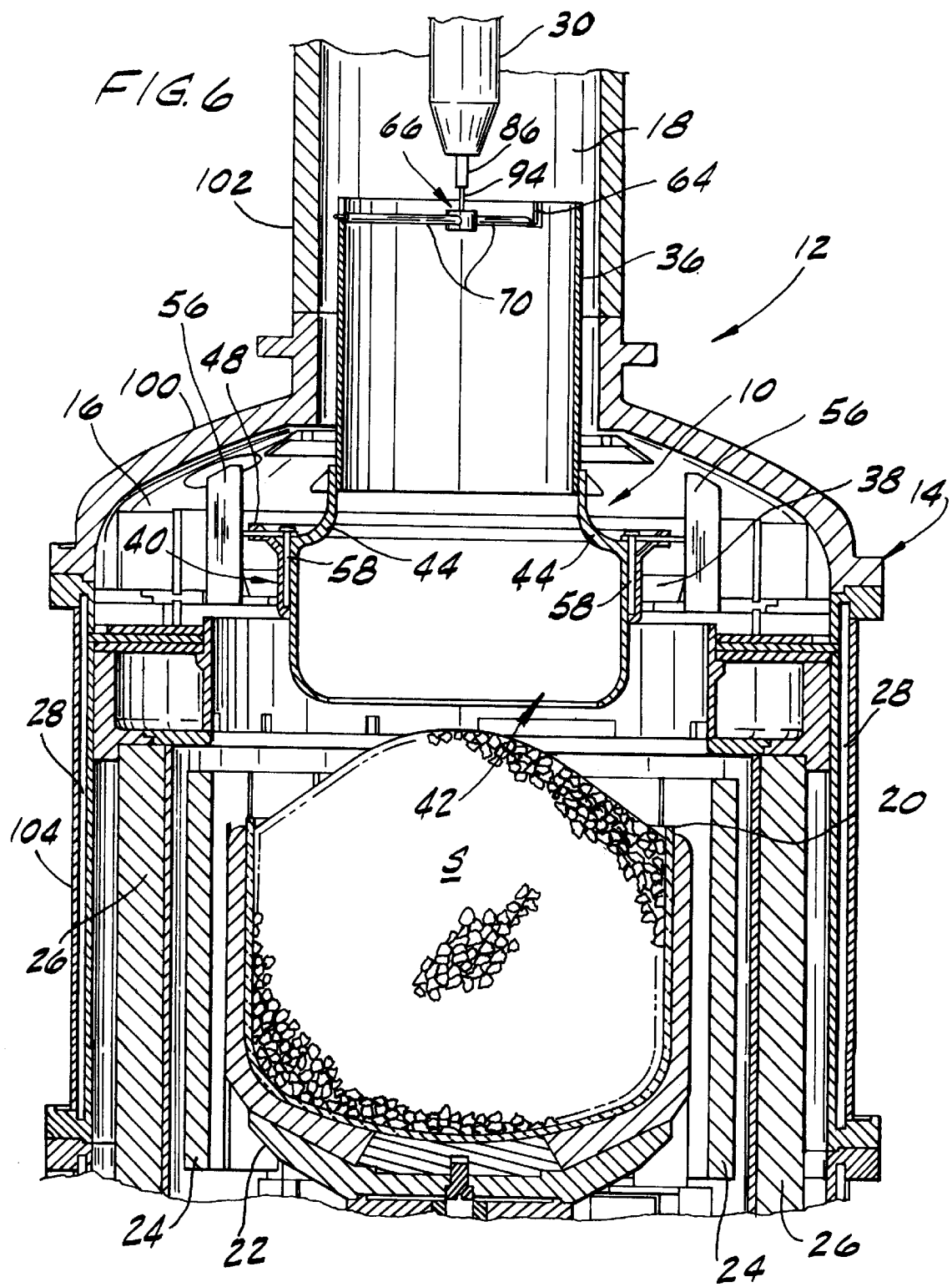
FIG. 6 is a cross section of a portion of the crystal puller at a later time during initial formation of the melt.

Guide pins 58 are received through holes in radially inner ends of respective guide/follower plates 52, through an arcuate cutout (not shown) in the lower heat shield and into a recess (not shown) in the intermediate heat shield 40. The guide pins 58 are free of fixed connection to the guide/follower plates 52, the intermediate heat shield 40 and the lower heat shield 42, but remain in fixed position relative to the intermediate shield in operation. The guide pins 58 guide motion of the upper and lower shields 36, 42 relative to the intermediate heat shield 40 between an extended position (FIGS. 1) and a retracted position (FIGS. 2 and 6). In the fully retracted position, the lower heat shield 42 engages the guide/follower plates 52 so that any further upward movement by the upper and lower heat shields 36, 42 will result in conjoint upward movement by the intermediate heat shield 40. In the fully extended position, a lip 60 on the lower heat shield 42 rests on a lip 62 of the intermediate heat shield 40 so that no further downward movement of the upper and lower heat shields 36, 42 relative to the intermediate heat shield is permitted. Thus, the intermediate heat shield 40 supports the upper and lower heat shields 36, 42 in the extended position. However, the upper and lower heat shields 36, 42 are able to move relative to the intermediate heat shield 40 between the extended and retracted positions, with the lower heat shield sliding along and being guided by the guide pins 58.

The upper heat shield 36 is made of silicon carbide coated graphite in a preferred embodiment, but may be made of other materials suitable for use in the environment of a crystal puller 12. For instance, it is contemplated that a multi-layered molybdenum construction (not shown) may be used in place of graphite. The upper heat shield 36 is operable to shield a portion of the ingot I having a temperature in the range of 1150° C. to 1000° C. from the relatively cool side walls of the crystal puller shell 14. Thus, heat transfer between the ingot I and the crystal puller 12 is reduced, and the number density of agglomerated defects in the ingot is reduced. The upper end of the upper heat shield 36 is formed with three, generally J-shaped slots 64 which permit a releasable, bayonet-type connection of a rotating hanger, generally indicated at 66, to the upper heat shield.

Figure 4:
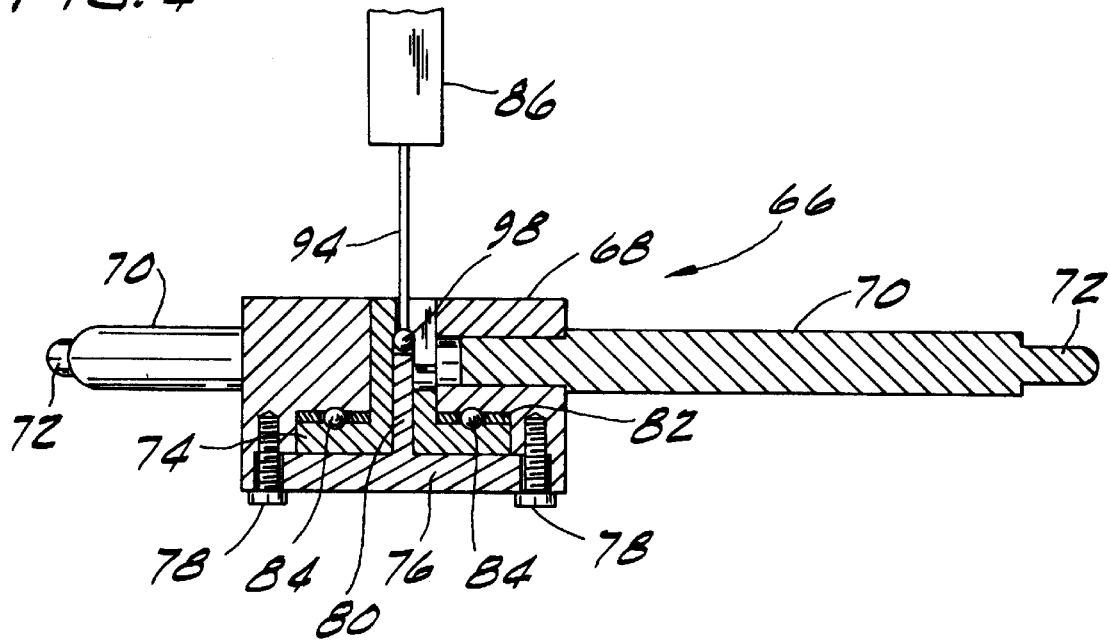
FIG. 4 is a cross section of the hanger.

As shown in FIGS. 3 and 4, the hanger 66 comprises a body 68 mounting three legs 70 projecting radially outwardly from the body at three equi-angularly spaced locations around the body. The legs 70 each have an end portion 72 of reduced diameter which is receivable in a corresponding one of the J-shaped slots 64 in the upper heat shield 36 to connect the hanger 66 to the upper heat shield. A mounting unit 74 is held in the body 68 by a retaining plate 76 attached by a pair of screws 78 to the body. The retaining plate 76 has a central axle 80 which is received in an opening (not shown) in the bottom of the mounting unit 74. A buffer plate 82 and ball bearings 84 are interposed within the body 68 between the mounting unit 74 and the body, permitting rotation of the body on the mounting unit. Thus, the pull shaft and seed crystal chuck 30 may rotate while the hanger 66 remains stationary.

An adaptor 86 is constructed for mounting on the seed crystal chuck 30 in the same way as (and in place of) the seed crystal 32. The adaptor 86 has an internal, downwardly opening cavity accessible through a generally key-shaped opening 88 in one side of the adaptor. The larger portion of the opening 88 receives a ball end 90 of a connecting cable (generally indicated at 92) into the cavity. A narrower portion of the key-shaped opening 88 of the receives a thinner shank 94 of the cable 92 such that the ball end 90 is held in the cavity and the shank projects downwardly below the adaptor 86. The mounting unit 74 of the hanger 66 also has an internal cavity into which the cable 92 may pass through a key-shaped opening 96 accessible through an opening (not shown) in the body 68. An opposite ball end 98 of the cable 92 is received through the larger portion of the key-shaped opening 96 and into the mounting unit 74. The shank 94 of the cable 92 is received through a narrower portion of the opening 96 and projects upwardly out of the mounting unit 74 and the body 68. Once the ball end 98 enters the cavity, it is held in the mounting unit 74. In this way the hanger 66 is hung on the adaptor 86 and carried by the seed crystal chuck 30 and pull shaft.

Figure 5:
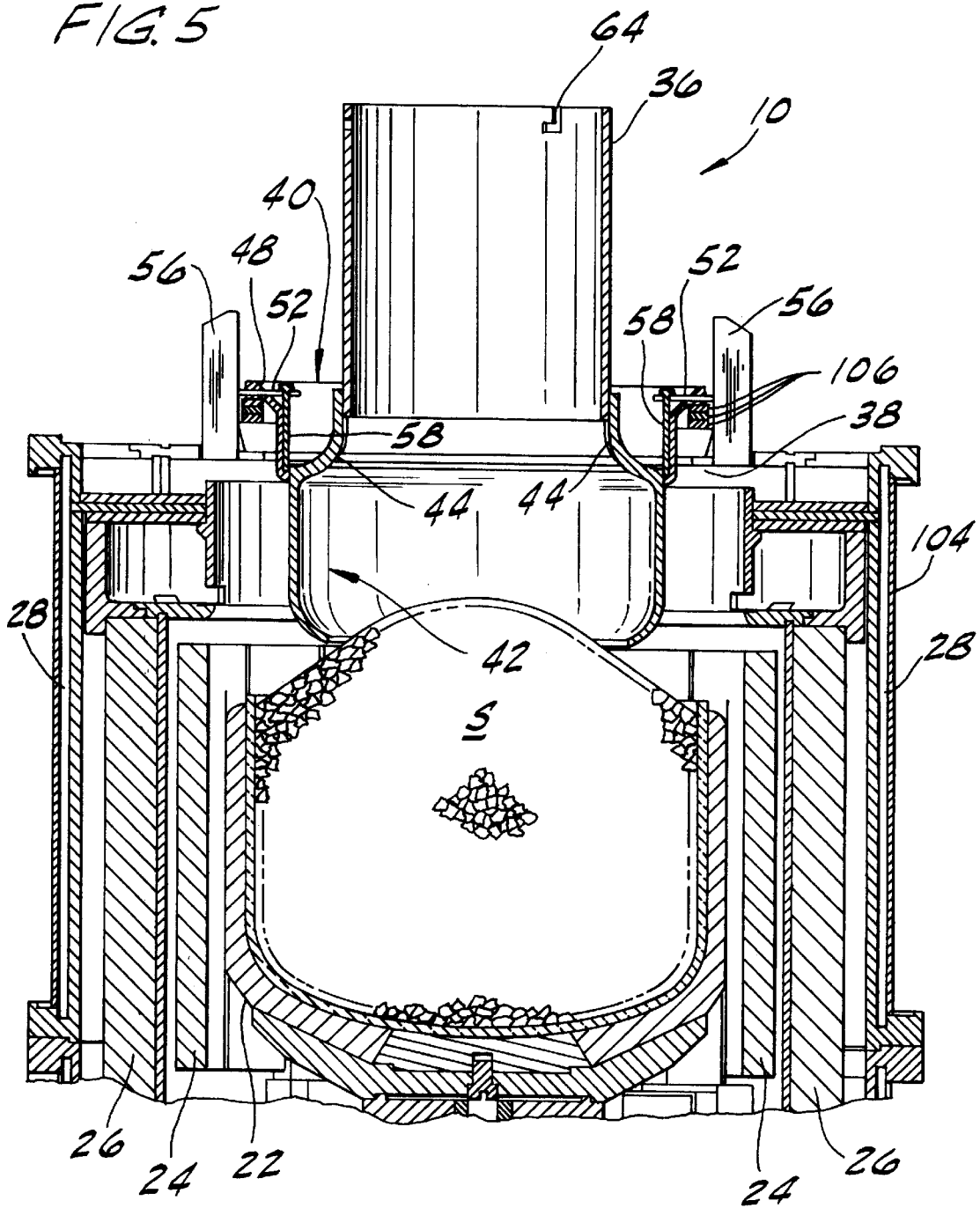
FIG. 5 is a schematic cross section of a portion of the crystal puller during initial formation of a melt in the crystal puller.

Referring now to FIGS. 1, 5 and 6, use of the heat shield assembly 10 will be described. An upper dome portion 100 and a pull chamber portion 102 of the crystal puller shell 14 are initially swung away from a growth chamber portion 104 of the shell, and solid polycrystalline silicon S is placed in the crucible 20. The crystal puller 12 is illustrated with the dome and pull chamber portions 100, 102 swung away in FIG. 5. The crucible is in a lowered position. The solid silicon S is only schematically illustrated in the drawings, but may be conventional chunk or fluid bed polycrystalline silicon. The heating panels 24 in the crystal puller 12 are inactive and the interior of the crystal puller is open to the room. A number (three in the illustrated embodiment) of generally U-shaped supports 106 are placed on the support structure 38 in the crystal puller 12. The heat shield assembly 10 is then placed in the crystal growth chamber 16 so that the lip 48 of the intermediate heat shield 40 rests on the supports 106. The lower heat shield 42 is fully extended from the intermediate heat shield 40 so that the lip 60 of the lower heat shield rests on the lip 62 of the intermediate heat shield, and the upper and lower heat shields 36, 42 are supported by the intermediate heat shield.

The dome and pull chamber portions 100, 102 of the shell 14 are then swung back over the crystal growth chamber portion 104 and heat shield assembly 10 is raised so that the upper heat shield 36 extends through the dome portion 100, out of the growth chamber 16 and into the pull chamber 18. Although not illustrated, at this time the dome portion 100 is not seated on the growth chamber portion 104 of the shell 14, but rather is spaced slightly above the growth chamber. The pull chamber 18 is accessible through a door (not shown) in the side of the pull chamber portion 102 of the shell 14. The hanger 66 and adaptor 86 will have been pre-assembled by inserting the ball ends 90, 98 of the cable 92 through the key-shaped openings in the adaptor and mounting unit 74, respectively. The adaptor 86 is inserted into the chuck 30 and secured (such as by pinning in a conventional manner). The hanger 66 is lowered by lowering the pull shaft and guided so that each leg 70 is received in one of the J-shaped slots 64 in the upper heat shield 36. The hanger 66 is then turned so that the reduced diameter ends 72 of the legs align with smaller, toe ends 108 of the J-shaped slots 64.

The winch is activated to raise the hanger 66 so that the reduced diameter ends 72 of the legs 70 are received in the toe ends 108 of the J-shaped slots 64 and the heat shield assembly 10 is raised off of the supports 106. As the hanger 66 is moved upwardly, the upper heat shield 36 and lower heat shield 42 initially move with the hanger, while the intermediate heat shield 40 remains stationary on the supports 106. The upper and lower heat shields 36, 42 are guided by guide pins 58 as the lower heat shield 42 telescopes partially into the intermediate heat shield 40. Near the top of the guide pins 58, the lower heat shield 42 engages guide/follower plates 52 so that the intermediate heat shield 40 is now supported by the lower heat shield. Further upward movement of the hanger 66 carries the intermediate heat shield 40 conjointly along with the upper and lower heat shields 36, 42, and raises the intermediate heat shield off of the supports. The intermediate heat shield 40 is held against any substantial rotational or lateral movement in the growth chamber 16 by the guide posts 56 which are received in the notches 54 in the outer ends of the guide/follower plates 52. The supports 106 are removed from the support structure 38 and taken out of the growth chamber 16.

The dome and pull chamber portions 100, 102 of the shell 14 are lowered down onto the growth chamber portion 104, as shown in FIG. 6. The winch is again activated to raise the heat shield assembly 10 up to the highest position. Preferably, a limit switch (not shown) is provided in the growth chamber 16 to automatically shut off the winch when the heat shield assembly 10 is fully raised. In this configuration, the upper heat shield 36 is disposed within a necked down portion of the growth chamber 16, and also the pull chamber 18. The lower heat shield 42 is telescoped into the intermediate heat shield 40 so that the heat shield assembly 10 has a very small profile within the growth chamber 16. The crucible 20 is raised within the growth chamber 16 and a vacuum is drawn in the crystal puller 12. The heating panels 24 are activated to melt the solid polycrystalline silicon S in the crucible 20.

After the solid silicon S is melted, the winch is activated to lower the heat shield assembly 10 down toward the crucible 20. The guide/follower plates 52 slide along the guide posts 56 to steady the motion of the heat shield assembly 10 as it moves downward. The lip 48 of the intermediate heat shield 40 engages the tabs 50 of the support structure 38, halting further downward movement of the intermediate heat shield. The upper and lower heat shields 36, 42 continue downwardly, with the lower heat shield sliding along guide pins 58. Once the lip 60 of the lower heat shield 62 engages the lip 62 of the intermediate heat shield 40, downward movement of the upper and lower heat shields 36, 42 is stopped. The upper and lower heat shields are supported by the intermediate heat shield 40, and the entire heat shield assembly 10 is located within the growth chamber 16.

The hanger 66 is lowered further so that its legs 70 drop out of the narrow toe ends 108 of the J-shaped slots 64. The hanger 66 is then turned by operation of the winch so that the legs 70 are aligned with wider portions of the J-shaped slots 64, and the winch is activated to raise the hanger, disconnecting it from the upper heat shield 36. The hanger 66 may then be raised upward out of the growth chamber 16 and into the pull chamber 18. An isolation valve of the crystal puller 12 is closed, isolating the growth chamber 16 from the pull chamber 18 so that low pressure and high temperature conditions may be maintained in the growth chamber. For simplicity of illustration, the isolation valve between the growth chamber 16 and pull chamber 18 has not be shown in the drawings. After cooling, the door of the pull chamber portion 102 is opened at the hanger 66 and adaptor 86 are removed from the seed crystal chuck 30.

A seed crystal 32 is mounted in the chuck 30 and the door of the pull chamber portion 102 is closed. The isolation valve is opened and the winch activated to lower the seed crystal 32 down to the molten silicon M in the crucible 20. As the seed crystal 32 begins to melt, the winch is activated to withdraw the seed crystal upwardly. Silicon freezes on the seed crystal 32 in a monocrystalline structure, after the Czochralski method, forming the generally cylindrical ingot I (FIG. 1). In its fully lowered position, the bottom edge of the lower heat shield 42 is preferably about 50–60 mm above the surface of the melt M in the crucible 20. The lower heat shield 42 prevents heat from radiating from the side walls of the crucible 20 to the ingot I except in the space between the bottom of the lower heat shield and the surface of the melt M. In addition, the heat shield assembly 10 is disposed between the ingot I at the cooler side walls of the shell 14, inhibiting heat transfer from the ingot. As a result, heat is conserved at the surface of the melt (i.e., the liquid-gas-solid interface), and increasing the temperature of the ingot I at the interface, thereby reducing the instantaneous axial temperature gradient $G_0$ in the ingot at the interface.

In the position illustrated in FIG. 1, an upper portion of the ingot I (shown in solid lines) has passed into the central passage of the lower heat shield 42. This portion of the ingot is shielded from the heat radiated from the side walls of the crucible 20. The portion of the ingot I in this higher position is also exposed to the opening spanned by the arms 44 between the upper and lower heat shields 36, 42. The portion of the ingot within the lower heat shield 42 now "sees" the cool side walls of the shell 14. Substantial heat transfer between the water cooled side walls of the shell 14 and the ingot I occurs and there is rapid cooling of the ingot within the lower heat shield 42.

The ingot I continues to grow, and a portion enters the upper heat shield 36, as shown in phantom in FIG. 1. The upper heat shield 36 is interposed between the sides of the ingot and the side walls of the shell 14. The upper heat shield 36 is positioned so that the portions of the ingot I entering the upper heat shield are approximately at 1150° C. Inside the upper heat shield 36, heat transfer from the ingot I to the side walls of the shell 14 is dramatically reduced so that the instantaneous temperature gradient $G_0$ is lessened in the portion of the ingot within the upper heat shield.

Thus, it may be seen that the several objects and features of the present invention are achieved by the heat shield assembly 10 and crystal puller 12 of the present invention. The heat shield assembly 10 is compact and constructed for partial collapse as it is raised to minimize the space necessary to operate within the growth chamber 16. Using the heat shield assembly 10, a high $v/G_0$ ratio is achieved at the liquid-gas-solid interface by reducing heat loss in the ingot I in the crucible 20 at the liquid-gas-solid interface. For example, the gradient $G_0$ may be reduced from 22.84 ° C./cm for unshielded Czochralski to 21.05 ° C./cm using the heat shield assembly and method of the present invention. The ratio of $v/G_0$ may be increased from 0.000060 cm$^2$/° C.-sec to 0.000047 cm$^2$/° C.-sec. Accordingly, there is a predominance of crystal lattice vacancies everywhere in the crystal and no radial vacancy/self-interstitial boundary ring in the ingot I. The ratio $v/G_0$ is increased without changing the pull rate v. In the preferred embodiment, the pull rate profile of crystals pulled is not altered substantially from ordinary, unshielded Czochralski. However, it is to be understood that variation in the pull rate may be employed to increase the ratio $v/G_0$. Rapid cooling of the ingot I is achieved within the lower heat shield 42 as is desirable by providing an opening between the upper and lower heat shields 36, 42. The ingot I is again shielded in the area where the ingot is between approximately 1150° C. and 1000° C. to reduce agglomeration of vacancies in the ingot. For example the temperature gradient in this region of the ingot I may be lowered from 14.1 ° C./cm to 11.7 ° C./cm with the heat shield assembly and method of the present invention.

One statement of the method of the present invention is as follows.

A method of growing vacancy rich single crystals comprising the steps of:

lowering a seed crystal into contact with a melt of molten semiconductor source material in a crucible of a crystal puller;

raising the seed crystal from the melt so that semiconductor material from the melt freezes on the seed crystal to form a single crystal;

directing heat radiated from the side walls of the crucible to a region adjacent the surface of the melt and located below the top of the crucible for inhibiting a high instantaneous axial thermal gradient in the single crystal in the region, whereby the single crystal has no vacancy/self-interstitial boundary ring or oxidation induced stacking fault ring;

thermally shielding the single crystal at a location above the melt surface to slow cooling of the crystal in the range of approximately 1150° C. to 1000° C.;

whereby the single crystal has a predominance of vacancy defects and a low density of agglomerated vacancy defects.

The method achieves both exclusive vacancy dominated material within the monocrystalline ingot I, and also reduces the agglomeration of the vacancy defects as the ingot is being formed in the crystal puller. In this way oxidation induced stacking faults in the ingot I are reduced.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A heat shield assembly for use in a crystal puller around a monocrystalline ingot grown in the crystal puller to affect cooling rates of the crystal, the heat shield assembly comprising:

an upper heat shield having a central passage for receiving the crystal therein such that the upper shield surrounds the crystal, the upper shield having connector means for connecting the heat shield assembly to a pulling mechanism of the crystal puller to raise and lower the heat shield assembly within the crystal puller;

an intermediate heat shield having a central passage for receiving the crystal through the intermediate heat shield with the intermediate heat shield surrounding the crystal, the intermediate heat shield being constructed for engaging structure in the crystal puller to support the heat shield assembly in the crystal puller;

a lower heat shield having a central passage for receiving the crystal through the lower heat shield with the lower heat shield surrounding the crystal, the lower heat shield being connected to the upper heat shield for conjoint movement therewith and being slidingly and telescopingly received in the intermediate heat shield;

the upper and lower heat shields being movable between a lower position in the crystal puller in which the lower shield is telescoped out of the intermediate heat shield and engages the intermediate heat shield for supporting the upper and lower heat shields, and a raised position in which the lower heat shield is telescoped upwardly into the intermediate heat shield and engages the intermediate heat shield for supporting the intermediate heat shield to move upwardly with the upper and lower heat shields.

2. A heat shield assembly as set forth in claim 1 further comprising guides for guiding the sliding motion of the lower heat shield in the intermediate heat shield.

3. A heat shield assembly as set forth in claim 2 wherein the lower heat shield includes a collar, the upper heat shield being received in the collar and connected to the lower heat shield therein.

4. A heat shield assembly as set forth in claim 3 wherein the intermediate heat shield has an annular lip at an upper edge thereof, the lip being engageable with the structure in the crystal puller to support the heat shield assembly therein.

5. A heat shield assembly as set forth in claim 1 further comprising a connector for connecting the heat shield assembly to a seed chuck on the pulling mechanism of the crystal puller.

6. A heat shield assembly as set forth in claim 5 wherein the connector includes a hanger selectively engageable with said connector means of the upper heat shield for connecting the upper heat shield to the pulling mechanism.

7. A heat shield assembly as set forth in claim 6 wherein said connector means comprises plural, generally J-shaped slots in the upper heat shield, the hanger including legs received in respective slots.

8. A crystal puller for forming a monocrystalline ingot, the crystal puller comprising:

a shell for isolating an interior of the crystal puller, the shell including a crystal growth chamber and a pull chamber having a smaller transverse dimension that the crystal growth chamber;

a crucible for holding molten semiconductor source material from which the monocrystalline ingot is grown, the crucible including a side wall and being movable vertically within the housing to maintain the surface of the melt at a substantially constant position;

a heater for heating the crucible and the interior of the crystal puller, the heater being disposed at least partially in vertical alignment with the side wall;

a pulling mechanism for pulling the ingot from the molten semiconductor source material;

support structure located within the shell generally above the crucible;

an upper heat shield located above the crucible and being free of engagement with the shell, the upper heat shield having a central passage for receiving the ingot, the upper heat shield surrounding any portion of the ingot received in the central passage thereof and substantially shielding the ingot from heat transfer with the shell for reducing the cooling rate of the portion of the ingot in the upper heat shield above the crucible;

a bottom heat shield constructed to rest on the support structure and extend downwardly into the crucible from the support structure, the bottom heat shield having a central passage for receiving a portion of the ingot in the bottom heat shield with the bottom heat shield interposed between the side wall of the crucible and the ingot for shielding the ingot portion from the side wall of the crucible for promoting cooling of the ingot portion within the crucible, bottom heat shield having a lower end spaced above the molten material and promoting heat transfer from the heater through the side wall to the ingot at locations below the bottom heat shield.

9. A crystal puller as set forth in claim 8 wherein the bottom heat shield includes an open upper portion opening the central passage of the bottom heat shield to the shell for promoting heat transfer of the portion of the ingot in the bottom shield with the shell.

10. A crystal puller as set forth in claim 9 wherein the bottom heat shield is connected to the upper heat shield for supporting the upper heat shield when the bottom heat shield rests on the support structure.

11. A crystal puller as set forth in claim 10 wherein the bottom heat shield comprises an intermediate shield and a lower shield, the lower heat shield being connected to the upper heat shield for conjoint movement therewith and being slidingly and telescopingly received in the intermediate heat shield, the upper and lower heat shields being movable between a lower position in the crystal puller in which the lower shield is telescoped out of the intermediate heat shield and engages the intermediate heat shield for supporting the upper and lower heat shields, and a raised position in which the lower heat shield is telescoped upwardly into the intermediate heat shield and engages the intermediate heat shield for supporting the intermediate heat shield to move upwardly with the upper and lower heat shields.

12. A crystal puller as set forth in claim 11 wherein the intermediate heat shield has an annular lip at an upper edge thereof, the lip being engageable with the structure in the crystal puller to support the upper and lower heat shields.

13. A crystal puller as set forth in claim 11 further comprising a seek chuck mounted on the pulling mechanism and a connector for connecting the upper heat shield to the seed chuck.

14. A crystal puller as set forth in claim 5 wherein the connector includes a hanger selectively engageable with the upper heat shield for connecting the upper heat shield to the pulling mechanism.

15. A crystal puller as set forth in claim 14 wherein the upper heat shield has plural, generally J-shaped slots in the upper heat shield, the hanger including legs received in respective slots.

16. A method of growing vacancy rich single crystals comprising the steps of:

placing solid semiconductor source material in a crucible of a crystal puller;

hanging a collapsible heat shield assembly on a pulling mechanism in the crystal puller above the crucible, the heat shield assembly as hung on the pulling mechanism being in a collapsed configuration;

heating the solid semiconductor source material to bring about melting of the source material;

lowering the heat shield assembly into engagement with support structure in the crystal puller generally above the crucible, the heat shield assembly assuming an extended position whereby a portion of the heat shield extends into the crucible in proximity to the surface of the molten semiconductor source material in the crucible;

disconnecting the heat shield assembly from the pulling mechanism;

attaching a seed crystal to the pulling mechanism;

lowering a seed crystal into contact with a melt of molten semiconductor source material in a crucible of a crystal puller;

raising the seed crystal from the melt so that semiconductor material from the melt freezes on the seed crystal to form a single crystal;

conserving heat in the crucible with the heat shield assembly in a region adjacent the surface of the melt and located below the top of the crucible for inhibiting a high instantaneous axial thermal gradient in the single crystal in the region, whereby the single crystal has no vacancy/self-interstitial boundary ring or oxidation induced stacking fault ring;

thermally shielding the single crystal with the heat shield assembly at a location above the melt surface to slow cooling of the crystal in the range of approximately 1150° C. to 1000° C.;

whereby the single crystal has a predominance of vacancy defects and a low density of agglomerated vacancy defects.

* * * * *

UNITED STATES PATENT AND TRADEMARK OFFICE
CERTIFICATE OF CORRECTION

PATENT NO. : 5,942,032

DATED : August 24, 1999

INVENTOR(S) : Kyong-Min Kim, et al.

It is certified that error appears in the above-identified patent and that said Letters Patent is hereby corrected as shown below:

Column 12, line 7, after "crucible," insert --the--.
Column 12, line 43, change "5" to --13--.

U. S. PATENT DOCUMENTS

| | | | | |
|---|---|---|---|---|
| 5,443,034 | 08/1995 | Everts | 117 | 208 |
| 5,683,505 | 11/1997 | Kuramochi et al. | 117 | 34 |

FOREIGN PATENT DOCUMENTS

| | | |
|---|---|---|
| 59008692 | 01/1984 | Japan(Abstract) |
| 07267777 | 03/1994 | Japan(Abstract) |
| 09315882 | 05/1996 | Japan(Abstract) |
| 595269 A1 | 05/1994 | EPO |

UNITED STATES PATENT AND TRADEMARK OFFICE
CERTIFICATE OF CORRECTION

PATENT NO. : 5,942,032

DATED : August 24, 1999

INVENTOR(S) : Kyong-Min Kim, et al.

It is certified that error appears in the above-identified patent and that said Letters Patent is hereby corrected as shown below:

OTHER DOCUMENTS(Including Author, Title, Date, Pertinent Pages, Etc.)
    International Search Report Column 11, line 43, change "that" to --than--.
Column 12, line 7, after "crucible," insert -- the ---.
Column 12, line 39, change "seek" to --seed--.

Signed and Sealed this

Twelfth Day of December, 2000

Attest:

Q. TODD DICKINSON

Attesting Officer    Director of Patents and Trademarks